United States Patent
Jeon et al.

(10) Patent No.: US 9,508,932 B2
(45) Date of Patent: Nov. 29, 2016

(54) LASER CRYSTALLIZATION SYSTEM, LASER CRYSTALLIZATION METHOD, AND METHOD OF FABRICATING DISPLAY DEVICE

(71) Applicant: SAMSUNG DISPLAY CO., LTD., Yongin, Gyeonggi-Do (KR)

(72) Inventors: Sang Hyun Jeon, Suwon-si (KR); Eun Jeong Cho, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/658,051

(22) Filed: Mar. 13, 2015

(65) Prior Publication Data

US 2016/0126457 A1    May 5, 2016

(30) Foreign Application Priority Data

Nov. 3, 2014   (KR) ........................ 10-2014-0151307

(51) Int. Cl.
| | | |
|---|---|---|
| *C30B 13/24* | (2006.01) | |
| *H01L 51/00* | (2006.01) | |
| *H01L 27/32* | (2006.01) | |
| *C30B 15/00* | (2006.01) | |

(52) U.S. Cl.
CPC .......... *H01L 51/0027* (2013.01); *C30B 13/24* (2013.01); *C30B 15/00* (2013.01); *H01L 27/3248* (2013.01)

(58) Field of Classification Search
CPC ............................... C30B 15/00; C30B 13/24
See application file for complete search history.

(56) References Cited

U.S. PATENT DOCUMENTS

| | | | | |
|---|---|---|---|---|
| 6,059,873 A | * | 5/2000 | Yamaguchi | ............. C30B 13/24 117/10 |
| 6,080,236 A | * | 6/2000 | McCulloch | ........... B24B 37/013 117/200 |
| 7,374,955 B2 | * | 5/2008 | Izumome | ................ C30B 15/00 117/3 |
| 2004/0018649 A1 | | 1/2004 | Shih et al. | |
| 2013/0341310 A1 | * | 12/2013 | Van Der Wilt | ......... C30B 13/24 219/121.62 |

FOREIGN PATENT DOCUMENTS

| | | |
|---|---|---|
| KR | 10-2004-0031622 A | 4/2004 |
| KR | 10-2009-0083301 A | 8/2009 |
| KR | 10-2011-0029157 A | 3/2011 |

* cited by examiner

*Primary Examiner* — Robert M Kunemund
(74) *Attorney, Agent, or Firm* — Lewis Roca Rothgerber Christie LLP

(57) ABSTRACT

A laser crystallization system, including an output unit configured to generate output laser light, an optical unit configured to split the output laser light into a first laser light and a second laser light, and to process the first laser light to have a crystallization energy density, a moving unit configured to move a target object to be irradiated with the first laser light and the second laser light, a detection unit configured to detect surface information of the target object utilizing the second laser light, and an input unit configured to receive the detected surface information and to transmit a control signal to the output unit and the moving unit, wherein the laser crystallization system is configured to detect the surface information of the target object and to crystallize the target object utilizing only the output laser light.

16 Claims, 9 Drawing Sheets

LASER CRYSTALLIZATION SYSTEM, LASER CRYSTALLIZATION METHOD, AND METHOD OF FABRICATING DISPLAY DEVICE

CROSS-REFERENCE TO RELATED APPLICATION

This application claims priority to and the benefit of Korean Patent Application No. 10-2014-0151307, filed on Nov. 3, 2014, in the Korean Intellectual Property Office, the disclosure of which is incorporated herein by reference in its entirety.

BACKGROUND

1. Field

Aspects of one or more embodiments of the present invention relate to a laser crystallization system, a laser crystallization method, and a method of fabricating a display device.

2. Description of the Related Art

A substrate (having thin-film transistors (TFTs) formed thereon) is commonly used in active matrix displays. A TFT using a polycrystalline semiconductor film is capable of operating at high speed due to its high electron mobility, as compared to a TFT using an amorphous semiconductor film. Accordingly, research is being conducted on a technique of forming a semiconductor film with a crystalline structure by crystallizing an amorphous semiconductor film formed on an insulating substrate, such as a glass substrate.

For crystallization, a thermal annealing method using furnace annealing, a rapid annealing method, a laser annealing method, or a combination thereof may be used.

The laser annealing method, among other annealing methods, may apply high energy only to a certain area to be crystallized without causing excessive variations in the temperature of a substrate.

In general, pulse laser beams of an excimer laser are used in laser annealing.

However, it is difficult to form a uniform crystalline semiconductor layer by applying oscillated laser beams onto a non-uniform semiconductor layer. This problem may be associated with the application of laser beams with a non-uniform intensity to a semiconductor layer without consideration of the deposition thickness of the semiconductor layer.

Non-uniform crystallization, which leads to non-uniform resistance of TFTs, may contribute to product defects.

The application of laser beams in consideration of the thickness of a semiconductor layer requires a measuring process for identifying the deposition map of the semiconductor layer, which, however, increases the number of processes for forming TFTs and may, thus, result in an increase in tack time.

SUMMARY

Aspects of some embodiments of the present invention are directed toward a laser crystallization system capable of improving the uniformity (e.g., the consistency) of the crystallization of a polycrystalline silicon layer.

Aspects of some embodiments of the present invention are directed toward a laser crystallization method capable of improving the uniformity (e.g., the consistency) of the crystallization of a polycrystalline silicon layer.

Aspects of some embodiments of the present invention are directed toward a method of fabricating a display device in which a uniformly-crystallized polycrystalline silicon layer is used as a semiconductor layer.

However, exemplary embodiments of the present invention are not restricted to those set forth herein. The above and other exemplary embodiments of the present invention will become more apparent to one of ordinary skill in the art to which the present invention pertains by referencing the detailed description of the present invention given below.

According to some exemplary embodiments, because crystallization energy and surface information may be obtained by using a single source and the intensity of laser light may be adjusted in consideration of non-uniformities (e.g., inconsistency) in the thickness of a layer, the uniformity (e.g., the consistency) of the crystallization of a polycrystalline silicon layer may be improved (e.g., increased).

Also, because crystallization energy and surface information may be obtained by using a single source, no measuring process for identifying a deposition map is needed. Accordingly, an entire operation may be simplified, and productivity may be improved (e.g., increased).

Other features and exemplary embodiments will be apparent from the following detailed description, the drawings, and the claims.

According to an aspect of the present invention, there is provided a laser crystallization system, including: an output unit configured to generate output laser light; an optical unit configured to split the output laser light into a first laser light and a second laser light, and to process the first laser light to have a crystallization energy density; a moving unit configured to move a target object to be irradiated with the first laser light and the second laser light; a detection unit configured to detect surface information of the target object utilizing the second laser light; and an input unit configured to receive the detected surface information and to transmit a control signal to the output unit and the moving unit, wherein the laser crystallization system is configured to detect the surface information of the target object and to crystallize the target object utilizing only the output laser light.

In an embodiment, the optical unit includes: a spectral lens on an optical path of the output laser light and configured to split the output laser light into the first laser light and the second laser light; a first reflective mirror on an optical path of the first laser light and configured to reflect the first laser light toward the target object; a second reflective mirror on an optical path of the second laser light and configured to reflect the second laser light toward the target object; and a density adjusting lens between the first reflective mirror and the spectral lens and configured to process the first laser light to have the crystallization energy density.

In an embodiment, the optical unit further includes: a projection lens between the target object and the first reflective mirror.

In an embodiment, the spectral lens includes: a first spectral lens configured to generate dispersed laser light with various directivities by dispersing the output laser light; and a second spectral lens on an optical path of the dispersed laser light and configured to split the dispersed laser light into laser light with uniform directivities including the first laser light with a first directivity and the second laser light with a second directivity.

In an embodiment, the second spectral lens includes: a convex portion configured to generate the first laser light with the first directivity by splitting the dispersed laser light; and a flat portion on one side of the convex portion and configured to generate the second laser light with the second directivity by splitting some of the dispersed laser light.

In an embodiment, the density adjusting lens includes: a first density adjusting lens configured to adjust the energy density of the first laser light; a second density adjusting lens configured to make the energy density of the first laser light uniform; and a third density adjusting lens configured to focus the processed first laser light.

In an embodiment, the optical unit includes a second reflective mirror on an optical path of the second laser light and configured to reflect the second laser light toward the target object, wherein the first density adjusting lens includes: a density adjusting portion on an optical path of the first laser light; and wherein an extended portion extending from the density adjusting portion to an optical path of the second laser light and configured to change the optical path of the second laser light so as to direct the second laser light toward the second reflective mirror.

In an embodiment, the detection unit includes a detector configured to detect a detection signal that is a reflection of the second laser light from the surface of the target object, and to detect the surface information of the target object, the surface information including thickness information and location information of the target object.

In an embodiment, the input unit includes: an indicator configured to display the detected surface information as collected information corresponding to a variation, over time, of the surface of the target object; and a controller configured to control the output unit or the moving unit based on the collected information.

In an embodiment, the controller is further configured to adjust an intensity of the output laser light or a moving speed of the moving unit.

In an embodiment, an area of the target object to which the first laser is applied and an area of the target object to which the second laser light is applied are arranged at regular intervals.

In an embodiment, the moving unit includes a stage configured to accommodate the target object, and a moving mechanism configured to move the stage.

In an embodiment, the moving unit is further configured to move in a direction from an area of the target object to which the first laser is applied to an area of the target object to which the second laser light is applied.

According to an aspect of the present invention, there is provided a laser crystallization method, the method including: outputting first output laser light having a first energy; splitting the laser light into a first laser light and a second laser light; applying the first laser light and the second laser light to a target object; crystallizing a first area of the target object utilizing the first laser light, and detecting surface information of a second area of the target object utilizing the second laser light; determining the surface information of the second area; and adjusting a crystallization energy for a thickness of the target object according to results of the determination.

In an embodiment, the adjusting of the crystallization energy includes: in response to the first area and the second area having a same thickness, moving the second area to a zone where the first laser light is applied; and crystallizing the second area utilizing the first laser light, and detecting surface information of a third area of the target object utilizing the second laser light.

In an embodiment, the adjusting of the crystallization energy includes: in response to the first area and the second area having different thicknesses, inputting surface information of the second area, moving the second area to a zone where the first laser light is applied, and outputting second output laser light with second energy, the second energy being different from the first energy; and crystallizing the second area utilizing the first laser light and detecting surface information of a third area of the target object utilizing the second laser light.

According to an aspect of the present invention, there is provided a method of fabricating a display device, the method including: forming an amorphous silicon layer on a substrate; forming a crystallized silicon layer by crystallizing the amorphous silicon layer; forming a semiconductor layer in a transistor region by patterning the crystallized silicon layer; forming a first insulating layer on the semiconductor layer, forming a gate electrode on the first insulating layer to correspond to the semiconductor layer, and forming a capacitor lower electrode in a capacitor region; forming a second insulating layer on the substrate where the gate electrode and the capacitor lower electrode are formed, forming an anode electrode on the second insulating layer in a pixel region, and forming a capacitor upper electrode in the capacitor region; forming a third insulating layer on the substrate where the anode electrode and the capacitor upper electrode are formed, forming a first opening region in the pixel region, forming a second opening region exposing part of the anode electrode therethrough, forming third opening regions exposing part of the semiconductor layer therethrough, and forming a source electrode connecting the anode electrode and the semiconductor layer, and a drain electrode connected to the semiconductor layer via one of the third opening regions by filing the third opening regions with a metal; and forming a fourth insulating layer on the substrate where the source electrode and the drain electrode are formed, forming a fourth opening region exposing part of the anode electrode therethrough, in an area corresponding to the first opening region, forming an organic light-emitting layer connected to the anode electrode, over the fourth opening region, and forming a cathode electrode on the organic light-emitting layer.

In an embodiment, the forming of the crystallized silicon layer includes: outputting first output laser light with first energy; splitting the laser light with the first energy into a first laser light and a second laser light; applying the first laser light and the second laser light to the amorphous silicon layer; crystallizing a first area of the amorphous silicon layer utilizing the first laser light and detecting surface information of a second area of the amorphous silicon layer utilizing the second laser light; determining the surface information of the second area; and adjusting crystallization energy for a thickness of the amorphous silicon layer according to results of the determination.

In an embodiment, the adjusting of the crystallization energy for the thickness of the amorphous silicon layer includes: in response to the first area and the second area having a same thickness, moving the second area to a zone where the first laser light is applied; and crystallizing the second area utilizing the first laser light having the first energy, and detecting surface information of a third area of the amorphous silicon layer utilizing the second laser light having the first energy.

In an embodiment, the adjusting the crystallization energy for the thickness of the amorphous silicon layer includes: in response to the first area and the second area having different thicknesses from each other, receiving surface information of the second area, moving the second area to a zone where the first laser light is applied, and outputting second output laser light with second energy, the second energy being different from the first energy; and crystallizing the second area utilizing the first laser light having the second energy, and detecting surface information of a third area of the amorphous silicon layer utilizing the second laser light having the second energy.

DETAILED DESCRIPTION

Figure 1:
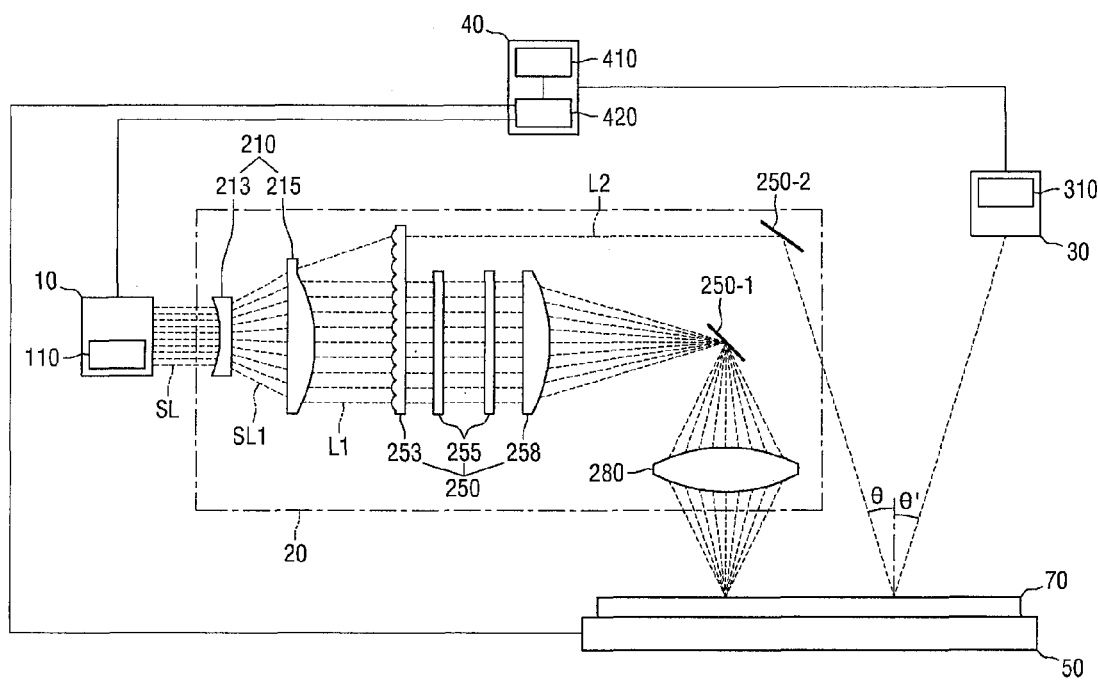
FIG. 1 is a schematic diagram illustrating a laser crystallization system according to an exemplary embodiment of the present invention.

Aspects and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the present invention to those skilled in the art, and the present invention will only be defined by the appended claims, and equivalents thereof.

In the drawings, the size and thickness of each element are arbitrarily illustrated for ease of description, and the present invention is not necessarily limited thereto.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. When an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Exemplary embodiments will hereinafter be described with reference to the accompanying drawings.

Figure 2:
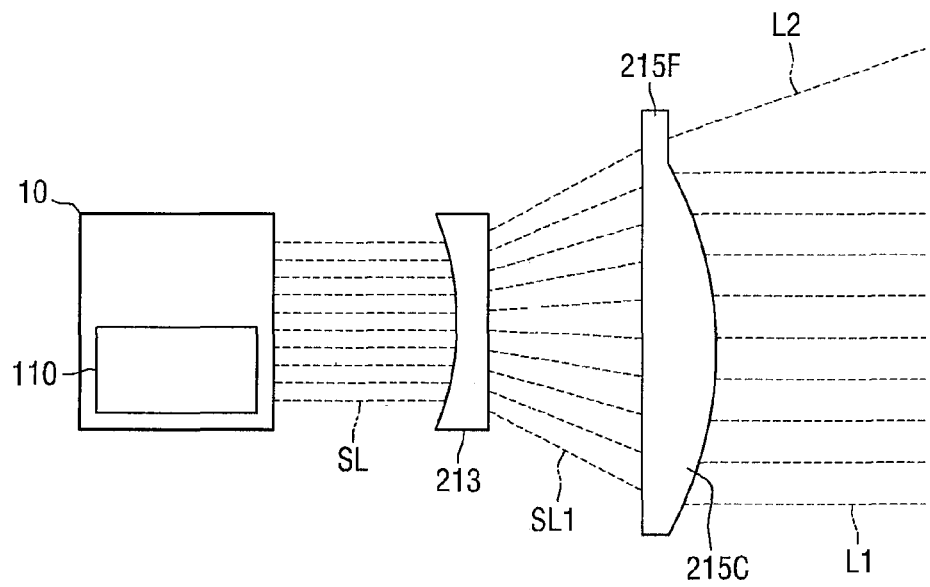
FIG. 2 is a schematic diagram illustrating a spectral lens illustrated in FIG. 1.
Figure 3:
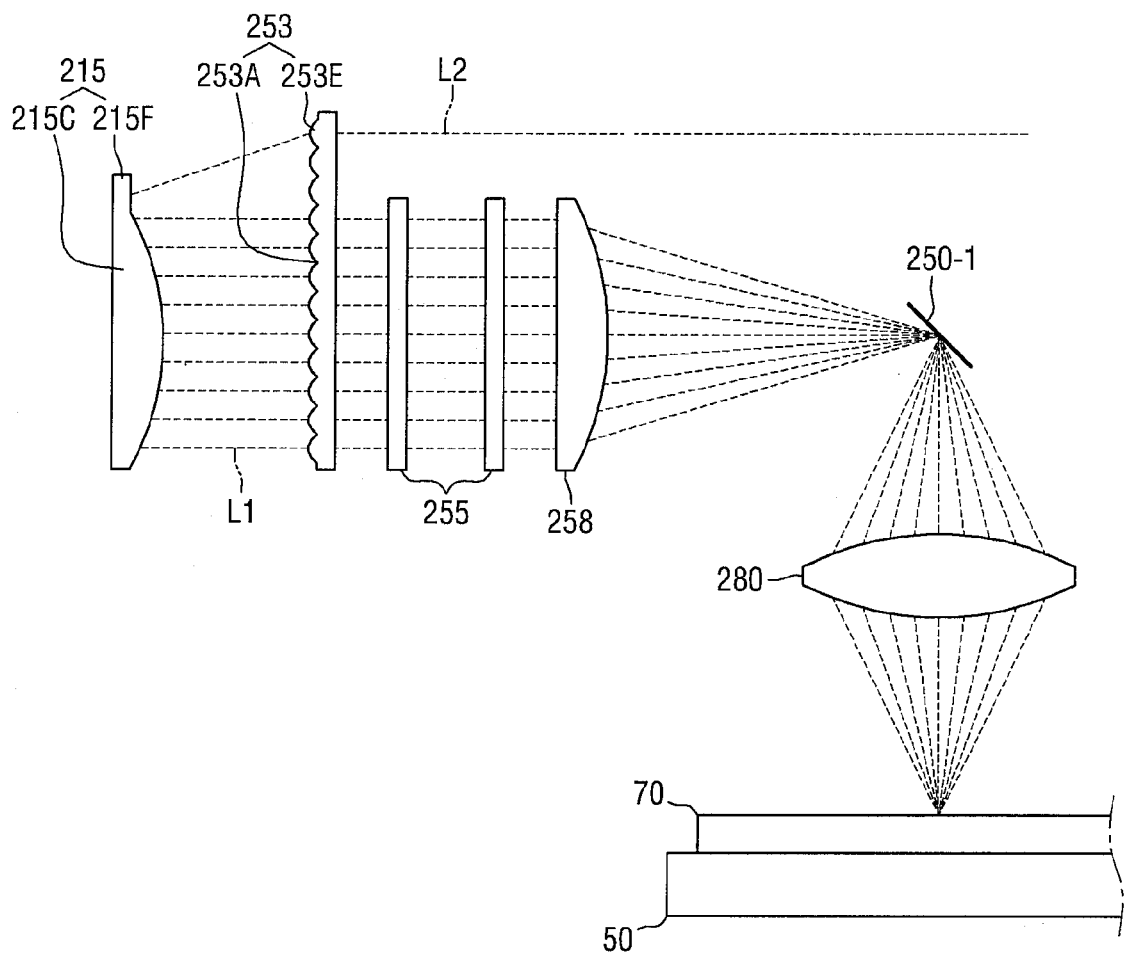
FIG. 3 is an enlarged schematic diagram illustrating a density-adjusting lens illustrated in FIG. 1.
Figure 4:
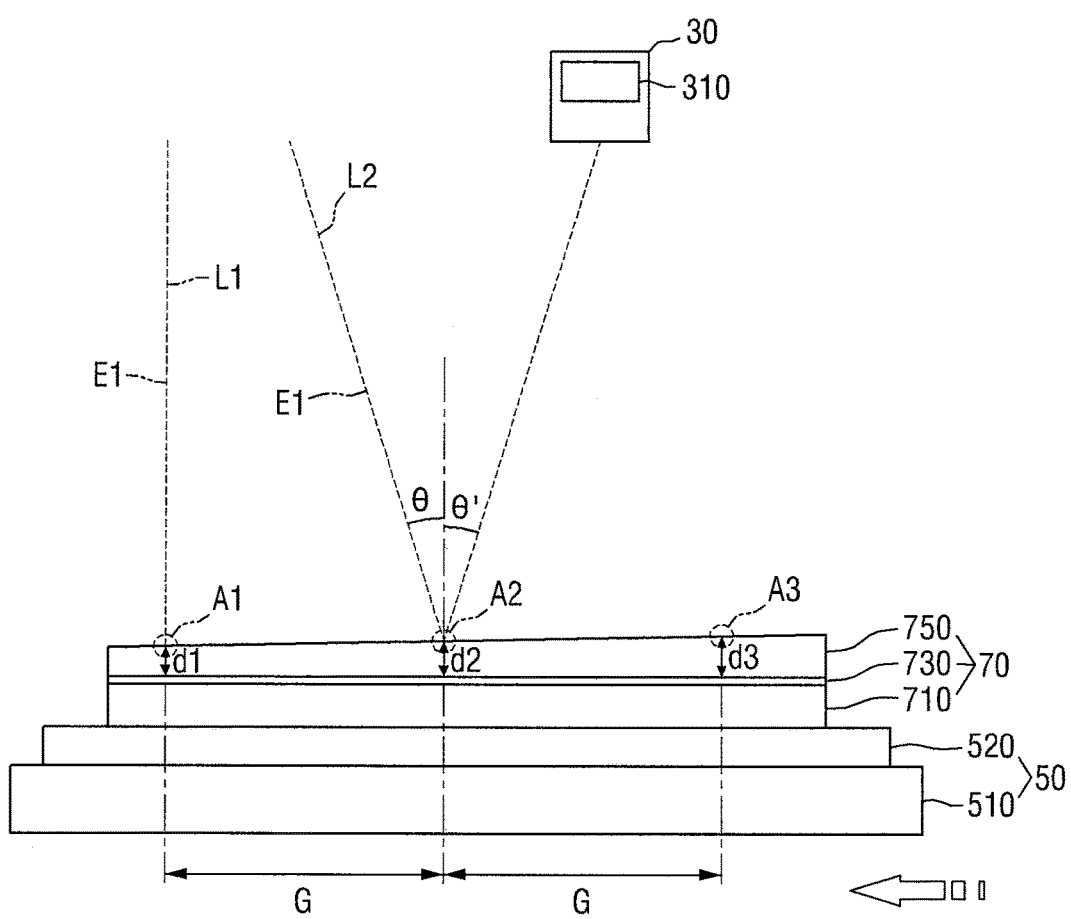
FIGS. 4 and 5 are schematic diagrams illustrating a moving unit of the laser crystallization system according to an exemplary embodiment of the present invention.
Figure 5:
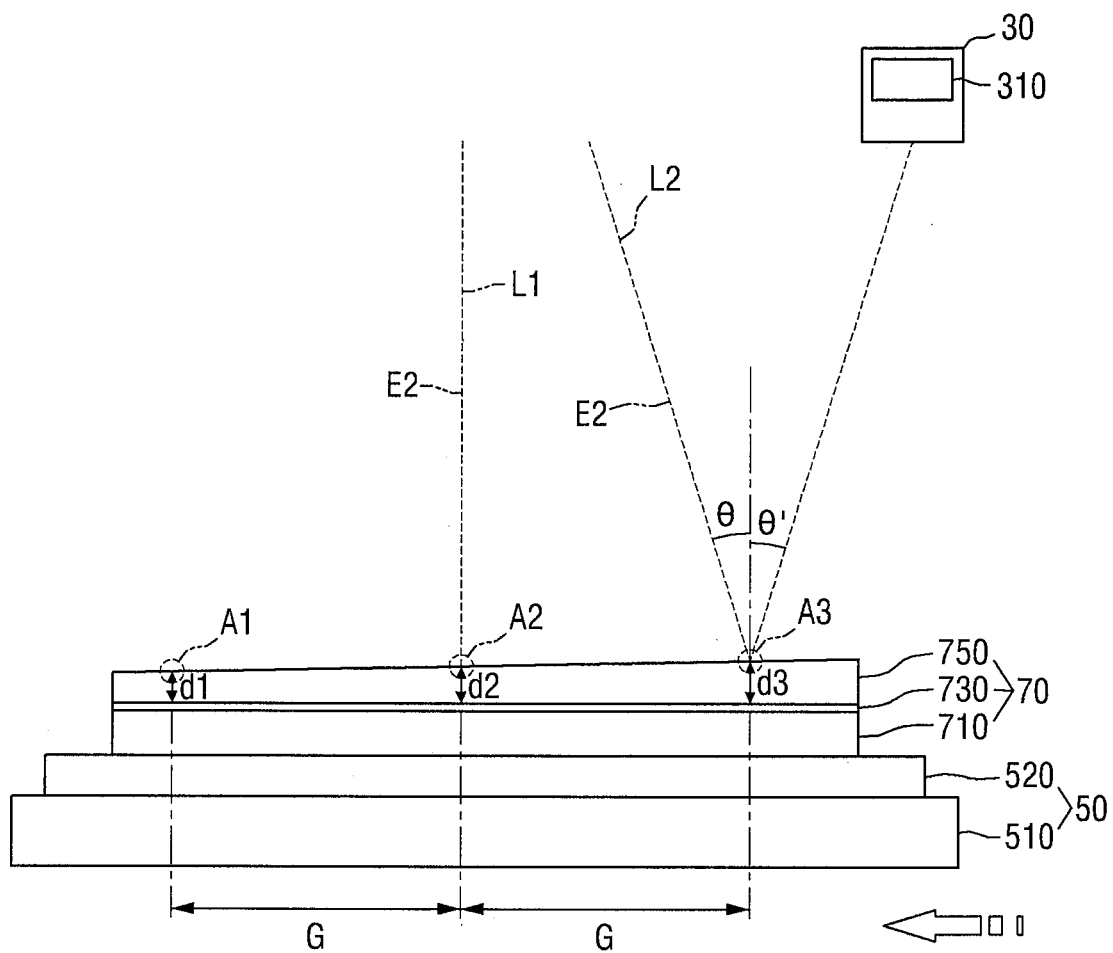

FIG. 1 is a schematic diagram illustrating a laser crystallization system according to an exemplary embodiment of the present invention. FIG. 2 is a schematic diagram illustrating a spectral lens illustrated in FIG. 1. FIG. 3 is an enlarged schematic diagram illustrating a density-adjusting lens illustrated in FIG. 1. FIGS. 4 and 5 are schematic diagrams illustrating a moving unit of the laser crystallization system according to an exemplary embodiment of the present invention.

A laser output device 110 may be provided in an output unit 10 of a laser crystallization system 1. The laser output device 110, which is a device for oscillating unprocessed laser light (hereinafter, referred to as output laser light SL), may generate (e.g., oscillate) laser light with a particular wavelength (e.g., a predetermined wavelength) in the form of a shot with a particular frequency (e.g., a predetermined frequency). For example, the laser output device 110 may be an oscillator, and the laser light generated by (e.g., oscillated by) the laser output device 110 may be excimer laser light.

The output unit 10 may include the laser output device 110, which generates (e.g., oscillates) one laser light selected from among Ar laser light, Kr laser light, $CO_2$ laser light, YAG laser light, $YVO_4$ laser light, YLF laser light, $YAlO_3$ laser light, ruby laser light, alexandrite laser light, Ti:sapphire laser light, helium cadmium laser light, copper vapor laser light, gold vapor laser light, a combination thereof and the like.

An optical unit 20 may be located in a direction in which the output unit 10 applies laser light. The optical unit 20 may process the output laser light SL, which is emitted from the laser output device 110, to have a shape and an energy density suitable for the crystallization of a target object 70. The optical unit 20 may split laser light so that the laser light may be utilized for detecting surface information of the target object 70.

The optical unit 20 may include a spectral lens 210, which splits the output laser light SL emitted from the output unit 10, a density adjusting lens 230, which processes laser light to have a crystallization energy density, and a first reflective mirror 250-1 and a second reflective mirror 250-2, which reflect laser light. The optical unit 20 may also include a projection lens 280, which is located between the target object 70 and the first reflective mirror 250-1.

The spectral lens 210 may be located at the front of the output laser light SL, which is emitted from the output unit 10, and may split some of the output laser light SL. The spectral lens 210 may split the output laser light SL into laser beams with different directivities.

Referring to FIG. 2, the output laser light SL, which is emitted from the output unit 10, may travel in a uniform (e.g., a substantially the same) direction. The spectral lens 210 may include a first spectral lens 213, which disperses the output laser light SL that travels in a uniform direction. The first spectral lens 213 may be, for example, a concave lens.

The output laser light SL transmitted through the first spectral lens 213 may be dispersed into dispersed laser light SL1 with a variety of directivities (e.g., transmittance directions). The dispersed laser light SL1 may include beams that travel in the same direction as the output laser light SL. A second spectral lens 215 may be located on an optical path of the dispersed laser light SL1 obtained from the first spectral lens 213.

The second spectral lens 215 may split the dispersed laser light SL1 and may thus obtain a plurality of laser beams each having a uniform directivity (e.g., having a same directionality). More specifically, the dispersed laser light SL1, which has various directivities, may be transmitted through the second spectral lens 215, thereby obtaining first laser light L1 with a first directivity and second laser light L2 with a second directivity.

The second spectral lens 215 may include a convex portion 215C and a flat portion 215F, which split the dispersed laser light SL1 into the first laser light L1 with a uniform directivity and the second laser light L2 with a uniform directivity.

The convex portion 215C may split the dispersed laser light SL1 with a variety of directivities and may thus generate the first laser light L1 with the first directivity. The convex portion 215C may change the optical path of the dispersed laser light SL1 so that the first light L1 is directed toward a region where the first light L1 may be processed to have a crystallization energy density.

The flat portion 215F may split some of the dispersed laser light SL1 with a variety of directivities, and may thus generate the second laser light L2 with the second directivity. Because the flat portion 215F splits the second laser light L2 with a different directivity from the first laser light L1 from the dispersed laser light SL1, the second laser light L2 may be used as laser light for detecting the surface information of the target object 70. For example, the flat portion 215F may change an optical path of some of the dispersed laser light SL1 or may maintain a dispersed direction of the dispersed laser light SL1, thereby generating the second laser light L2 with a different directivity from the first laser light L1.

The flat portion 215F, which generates the second laser light L2 with a different directivity from the first laser light L1, may be provided on a side of the convex portion 215C so as to readily split some of the dispersed laser light SL1.

Referring back to FIG. 1, the second laser light L2 may be guided to the second reflective mirror 250-2, and may thus be used as laser light for detecting the surface information of the target object 70, and the first laser light L1 may be guided to the first reflective mirror 250-1, and may thus be used as laser light for crystallizing the target object 70.

The first reflective mirror 250-1 and the second reflective mirror 250-2 may be located on the optical paths of the first laser light L1 and the second laser light L2, respectively, and may thus change the optical paths of the first laser light L1 and the second laser light L2 so that the first laser light L1 and the second laser light L2 are applied onto the surface of the target object 70 at the same time. For example, front coated mirrors may be used as the first reflective mirror 250-1 and the second reflective mirror 250-2.

The density adjusting lens 250 may be located on a path along which the first laser light L1 is emitted. The general functions of the density adjusting lens 250, other than that of changing the optical path of the second laser light L2, will hereinafter be further described. More specifically, the density adjusting lens 250 may be located between the spectral lens 210 and the first reflective mirror 250-1, and particularly, between the convex portion 215C of the second spectral lens 215 and the first reflective mirror 250-1.

The density adjusting lens 250 may include a first density adjusting lens 253, which adjusts the density of the energy of the first laser light L1, second density adjusting lenses 255, which make the energy density of the first laser light L1 uniform (e.g., substantially constant), and a third density adjusting lens 258, which focuses the first laser light that is processed.

Referring to FIG. 3, the first density adjusting lens 253 may be located between the spectral lens 210 and the first or second reflective mirror 250-1 or 250-2, and particularly, on a path along which the first laser light L1 or the second laser light L2 travels after being transmitted through the spectral lens 210.

The first density adjusting lens 253 may include a density adjusting portion 253A, which is located on the optical path of the first laser light L1, and an extended portion 253E, which extends from the density adjusting portion 253A to the optical path of the second laser light L2.

The density adjusting portion 253A of the first density adjusting lens 253 may be an attenuator located on the optical path of the first laser light L1 to adjust the energy density of the first laser light L1. The first density adjusting lens 253 may be used together with a pulse duration extender. The growth of crystals with the use of laser light is closely related to the duration of laser pulses, and the pulse duration extender may extend the duration of laser pulses.

The extended portion 253E of the first density adjusting lens 253 may extend from the density adjusting portion 253A to the optical path of the second laser light L2. The extended portion 253E may change the optical path of the second laser light L2 so that the second laser light L2 travels toward the second reflective mirror 250-2. If there has to be provided different structures for splitting the output laser light SL into the first laser light L1 and the second laser light L2 having different directivities and for handling the first laser light L1 and the second laser light L2, the laser crystallization system 1 may occupy a considerable amount of space, that is, the laser crystallization system 1 may suffer from space limitations due to split laser beams. However, because the extended portion 253E may change the optical path of the second laser light L2, the use of the space of the laser crystallization system 1 may be improved (e.g., increased).

Referring back to FIG. 1, the second density adjusting lenses 255 may be located between the first density adjusting lens 253 and the third density adjusting lens 258. The second density adjusting lenses 255 may be located on the optical path of the first laser light L1.

The second density adjusting lenses 255 may be homogenizers making the energy density of the first laser light L1 uniform (e.g., substantially constant). The second density adjusting lenses 255 may include two pairs of lens arrays, but the present invention is not limited thereto.

The third density adjusting lens 258 may be located between the second density adjusting lenses 255 and the first reflective mirror 250-1. The third density adjusting lens 258 may be located on the optical path of the first laser light L1. The third density adjusting lens 258 may be a condenser lens focusing the first laser light L1. The third density adjusting lens 258 may focus the first laser light L1 onto a reflective surface of the first reflective mirror 250-1.

The optical unit 20 may also include the projection lens 280, which is located between the first reflective mirror 250-1 and the target object 70. The projection lens 280 may synthesize and amplify the first laser light L1 and may apply the first laser light L1 to the target object 70. The first laser light L1 may be applied onto the surface of the target object 70 in a spot shape or a linear shape, but the present invention is not limited thereto. The first laser light L1 may crystallize the target object 70 by melting and cooling the surface of the target object 70.

The second laser light L2 may have its optical path changed by the extension portion 253E of the first density adjusting lens 253 and may thus be applied to the second reflective mirror 250-2. No lenses for processing the second laser light L2 may be located between the extended portion 253E and the second reflective mirror 250-2.

The second laser light L2 may be reflected by the second reflective mirror 250-2 and may thus be applied onto the surface of the target object 70. The second laser light L2 may be applied to the target object 70 at an incidence angle (e.g., a predetermined incidence angle) A, and may be reflected from the surface of the target object 70 at the same angle as the incidence angle θ, that is, a reflection angle A'.

The laser crystallization system 1 may also include a detection unit 30, which detects the second light L2 reflected from the target object 70 at the reflection angle θ'. The detection unit 30 may include a detector 310, which receives a signal of the second laser light L2 reflected from the surface of the target object 70 and thus detects the surface information of the target object 70. The detector 310 may include an ellipsometer, which measures a variation in the polarization state of light. For example, in response to already-known polarized light (e.g., 45° linearly polarized light) being applied to the target object 70, the polarization state of the light may be changed by the surface of the target object 70, and the ellipsometer may measure the change of the polarization state of the light. The thickness, refractive index and location of the target object 70 may be measured by measuring a variation in the polarization state of the second light L2. Accordingly, the surface information of the target object 70, detected by the detection unit 30, may include the thickness, refractive index and location of the target object 70.

The detection unit 30 may provide the detected surface information to an input unit 40. The input unit 40 may include an indicator 410, which displays collected information regarding the variation, over time, of the surface of the target object 70, and a controller 420, which controls the output unit 10 or a moving unit 50 based on the collected information.

The indicator 410 may display the detected surface information provided by the detection unit 30 as the variation, over time, of the surface of the target object 70. For example, the indicator 410 may be an oscilloscope. The indicator 410 may display the variation, over time, of the surface of the target object 70. The thickness of the target object 70 may be determined based on the information displayed by the indicator 410.

Determination information obtained from the information displayed by the indicator 410 may be input to the controller 420. The controller 420 may input the determination information to the output unit 10 or the moving unit 50. More specifically, the controller 420 of the input unit 40 may provide the surface information of the target object 70 to the output unit 10, and may thus control the intensity of the output laser light SL. Also, the controller 420 of the input unit 40 may provide the surface information of the target object 70 to the moving unit 50 and may thus control the moving speed of the moving unit 50.

The moving unit 50 may accommodate the target object 70 thereon, and may move the target object 70. The moving unit 50 may be located in a direction in which the first laser light L1 and the second laser light L2, which are split from the output laser light SL, are applied after being reflected from the first reflective mirror 250-1 and the second reflective mirror 250-2, respectively. The moving unit 50 may move the target object 70, and may thus allow different parts of the target object 70 to be irradiated with the first laser light L1 and the second laser light L2.

The laser crystallization system 1 may detect the surface information of the target object 70 and, at the same time, perform the crystallization of the target object 70 by splitting the output laser light SL, which is provided by a single source. Also, because the laser crystallization system 1 collects the surface information of the target object 70 and, at the same time, performs the crystallization of the target object 70 by splitting the output laser light SL, which is provided by a single source, the crystallization of the target object 70 may be simplified, and the amount of time that it takes to crystallize the target object 70 may be reduced. Also, because the surface information of the target object 70 may be identified in advance, the degree of the crystallization of the target object 70 may be improved (e.g., increased) regardless of non-uniformities in the thickness of the target object 70.

Referring to FIGS. 4 and 5, in the laser crystallization system 1, the target object 70 may be located on the moving unit 50.

The target object 70 may include a substrate 710 and an amorphous silicon layer 750 formed on the substrate 710. A buffer layer 730 may be formed between the amorphous silicon layer 750 and the substrate 710.

The substrate 710 may be formed of a substantially transparent (e.g., a transparent) glass material having $SiO_2$ as a main ingredient thereof, but the present invention is not limited thereto. For example, the substrate 710 may be formed of a transparent plastic material. The plastic material may be an organic material including one or more of polyethersulphone (EPS), polyacrylate (PAR), polyetherimide (PEI), polyethyelenen napthalate (PEN), polyethylene terephtalate (PET), polyphenylene sulfide (PPS), polyallylate, polyimide (P1), polycarbonate (PC), cellulose triacetate (TAC), cellulose acetate propionate (CAP), and the like.

The buffer layer 730 may form a flat, smooth surface at the top of the substrate 710, and may prevent impurities from infiltrating into the amorphous silicon layer 750. The buffer layer 730 may be formed as a single- or double-layer of silicon nitride and/or silicon oxide. The buffer layer 730 may be formed by depositing an organic material or an inorganic material selected from among SiNx, $SiO_2$, SiON, $Al_2O_3$, $TiO_2$, $Ta_2O_5$, $HfO_2$, $ZrO_2$, BST and PZT with the use of various suitable deposition methods, such as plasma enhanced chemical vapor deposition (PECVD), atmospheric pressure chemical vapor deposition (APCVD), or low pressure chemical vapor deposition (LPCVD).

The amorphous silicon layer 750 may be located on the buffer layer 730. A polycrystalline silicon layer may be formed by applying laser light to the amorphous silicon layer 750 of the target object 70, and the first laser light L1 and the second laser light L2 may both be provided to the amorphous silicon layer 750. The polycrystalline silicon layer may be used as a semiconductor layer.

The first laser light L1 may provide crystallization energy to the amorphous silicon layer 750, and may thus crystallize the amorphous silicon layer 750 by melting and cooling the amorphous silicon layer 750. The second laser light L2 may be applied onto the surface of the amorphous silicon layer 750. The detection unit 30 may detect the second laser light L2 reflected from the surface of the target object 70, and may thus collect the surface information of the target object 70. The provision of crystallization energy with the use of the first laser light L1 and the collection of the surface information of the target object 70 with the use of the second laser light L2 may be performed at the same time.

The target object 70 may be located on the moving unit 50. The moving unit 50 may include a stage 520 on which the target object 70 is accommodated and moving mechanisms 510 which moves the stage 520. The moving mechanism 510 may move the stage 520 so as to move the target object 70 accommodated on the stage 520. Accordingly, by using the moving mechanism 510, it is possible to allow different parts of the target object 70 to be irradiated with the first laser light L1 and the second laser light L2.

The moving unit 50 may be moved in a direction from a zone where the second laser light L2 is applied to a zone where the first laser light L1 is applied. The areas to which the first laser light L1 and the second laser light L2, which are split from a single source (i.e., the output laser light SL) are respectively applied may be arranged at regular intervals of a distance G. A surface information map of the amorphous silicon layer 750 may be created in real time based on the distance G, and the moving speed of, and the distance traveled by, the moving mechanism 510. Because the distance G is uniform, surface information of the amorphous silicon layer 750 may be collected in real time by controlling the moving speed of the moving mechanism 510.

Location information and thickness information of the amorphous silicon layer 750 may be obtained by controlling the moving speed of the moving mechanism 510. The intensity of the output laser light SL for crystallization may be varied or adjusted based on the surface information of the amorphous silicon layer 750. The collection of the surface information of the amorphous silicon layer 750 and the crystallization of the amorphous silicon layer 750 may be performed at the same time.

More specifically, as illustrated in FIG. 4, the amorphous silicon layer 750 may not necessarily have a uniform thickness (e.g., a constant thickness). For example, the amorphous silicon layer 750 may include a first area A1, a second area A2 and a third area A3 having different thicknesses from one another. The amorphous silicon layer 750 may have a thickness d1 in the first area A1, a thickness d2, which is greater than the thickness d1, in the second area A2, and a thickness d3, which is greater than the thickness d2, in the third area A3.

The first, second, and third areas A1, A2, and A3 having different thicknesses from one another may be provided with different crystallization energies to improve (or enhance) the degree of the crystallization of the amorphous silicon layer 750. Parts of the amorphous silicon layer 750 with different thicknesses may need different crystallization energies.

If the same crystallization energy is provided to the first, second, and third areas A1, A2, and A3 having different thicknesses from one another, the amorphous silicon layer 750 may not be sufficiently melted in the third area A3 where the amorphous silicon layer 750 is formed thick, and as a result, amorphous silicon may remain uncrystallized. For example, when the crystallization energy for the first area A1 is provided to the third area A3, the amorphous silicon layer 750 may remain uncrystallized in at least part of the third area A3, and as a result, there may still be amorphous silicon in the third area A3. Thus, the amorphous silicon layer 750 may not be uniformly crystallized. Accordingly, the degree of the crystallization of the amorphous silicon layer 750 may decrease, and, as a result, the quality of TFTs that use a polycrystalline silicon layer as a semiconductor layer may deteriorate.

In a related-art crystallization method, the thickness of the amorphous silicon layer 750 may be measured first, and a deposition map of the amorphous silicon layer 750 may be created based on the results of the measurement. Then, the degree of the crystallization of the amorphous silicon layer 750 may be improved (e.g., increased) by controlling the crystallization energy for the amorphous silicon layer 750 based on the deposition map. The related-art crystallization method, however, requires separate acts of creating a deposition map and crystallizing the amorphous silicon layer 750, thereby increasing the number of processes that need to be performed and the total amount of processing time.

On the other hand, the laser crystallization system 1 may crystallize the amorphous silicon layer 750 with the first laser light L1 and, at the same time, detect the surface information of the amorphous silicon layer 750 with the second laser light L2 so as to create a deposition map such as the deposition thickness of the amorphous silicon layer 750.

Referring to FIGS. 4 and 5, the amorphous silicon layer 750 may be crystallized in the first area A1 with the use of the first laser light L1 with first energy E1. Before the crystallization of the first area A1, the surface information of the second area A2 may be collected with the use of the second laser light L2. Because the first laser light L1 and the second laser light L2 are both split from the same source, that is, the output laser light SL with the first energy E1, the second laser light L2 may also have the first energy E1. However, because the second laser light L2 is unprocessed laser light, the second laser light L2 does not have the crystallization energy capable of melting the amorphous silicon layer 750.

The amorphous silicon layer 750 of the target object 70 may be moved by the moving unit 50, and the second area A2 of the amorphous silicon layer 750 may be moved to the zone where the first laser light L1 is applied. Before the movement of the amorphous silicon layer 750 to the zone where the first laser light L1 is applied, the surface information of the amorphous silicon layer 750 may be collected from the third area A3 by applying the second laser light L2. For example, the moving unit 50 may move the target object 70 from a detection zone (i.e., a zone where the second laser light L2 is applied) to a crystallization area (i.e., the zone where the first laser light L1 is applied).

The first laser light L1, which is applied to the second area A2, may provide sufficiently high crystallization energy to crystallize the second area A2, and as a result, the second area A2 may be crystallized. The first area A1 and the second area A2 may have different thicknesses from each other. Accordingly, the first energy E1 provided to the first area A1 may not be sufficient to melt and crystallize the second area A2, and thus, second energy E2 may be provided to the second area A2 to crystallize the second area A2. The second energy E2 may be obtained by providing the surface information obtained with the use of the second laser light L2 to the input unit 40 and allowing the input unit 40 to provide the surface information to the output unit 10 so as to control crystallization energy.

Because the zone where the first laser light L1 is applied and the zone where the second laser light L2 is applied are arranged at regular intervals of the distance G, the moving speed of the moving mechanism 510 may be controlled to correspond to a variation in the thickness of the target object 70, which is provided to the input unit 40, so as to control the duration of crystallization.

The laser crystallization system 1 may crystallize the amorphous silicon layer 750 with the use of the first laser light L1 and, at the same time, detect the deposition thickness of the amorphous silicon layer 750 with the use of the second laser light L2 so as to generate detection information. The detection information is provided to the input unit 40 so that the input unit 40 generates determination information, and the determination information is provided to the output unit 10 so that the output unit 10 controls the intensity of the output laser light SL and the moving speed of the moving unit 50. By performing crystallization and the collection of surface information at the same time, the amount of time that it takes to perform crystallization may be reduced, and as a result, productivity may be improved (e.g., increased).

Figure 6:
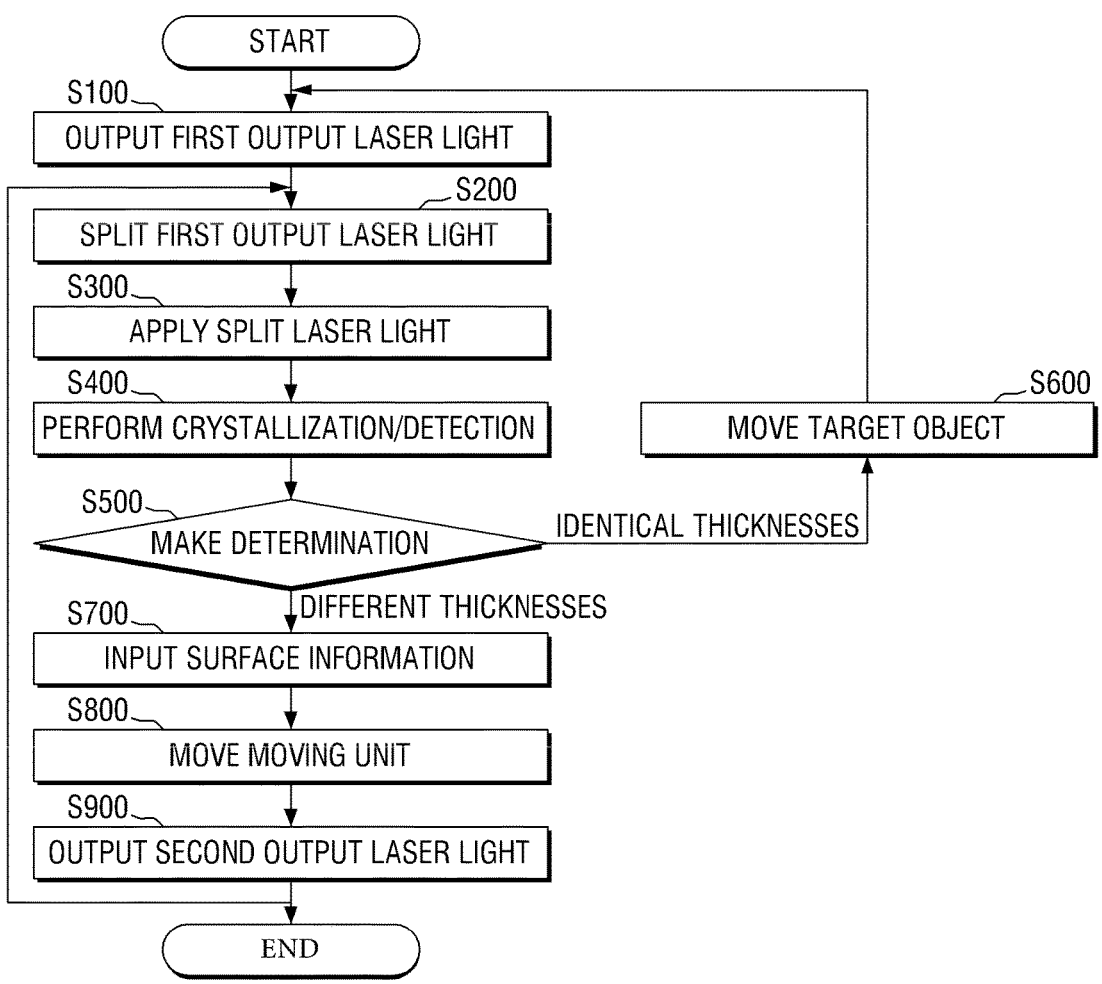
FIG. 6 is a flowchart illustrating a laser crystallization method using a laser crystallization system, according to an exemplary embodiment of the present invention.

FIG. 6 is a flowchart illustrating a laser crystallization method using a laser crystallization system, according to an exemplary embodiment of the present invention. The laser crystallization method will hereinafter be described with reference to FIGS. 1 to 6. For convenience and clarity, descriptions of elements that have already been described with reference to FIGS. 1 to 5 may be omitted or simplified.

Referring to FIG. 6, the laser crystallization system 1 may allow the output unit 10 to emit first output laser light SL (S100). The first output laser light SL may have first energy E1.

The first output laser light SL with the first energy E1 may be split into first laser light L1 and second laser light L2 by the optical unit 20 (S200), as described above with reference to FIGS. 1 to 3. The first laser light L1 may be processed into laser light with crystallization energy for crystallizing the target object 70 by being transmitted through the density adjusting lens 250. The second laser light L2 may be applied to the second reflective mirror 250-2 without being processed into laser light with the crystallization energy for the target object 70.

The first laser light L1 and the second laser light L2 may be applied at the same time toward the moving unit 50 where the target object 70 is accommodated (S300). The first laser light L1 may be processed to have the crystallization energy for the target object 70 and may thus crystallize the target object 700. The second laser light L2 may be applied to the target object 70 at an incidence angle (e.g., a predetermined incidence angle), and may thus be used to collect surface information of the target object 70.

The first laser light L1 with the first energy E1 may be applied to the first area A1. The second laser light L2 with the first energy E1 may be applied to the second area A2. The second laser L2 may be applied to the second area A2 at the incidence angle $\theta$.

The first area A1 may be crystallized with the use of the first laser light L1, and the surface information of the second area A2 may be detected with the use of the second laser light L2 (S400). The surface information of the target object 70 measured by the detection unit 30 may include thickness information, location information and refractive index information. That is, crystallization and the detection of surface information may be performed at the same time.

The detected surface information may be provided to the input unit 40. The input unit 40 may determine the surface information of the target object 70 based on the detected surface information (S500). The input unit 40 may collect information regarding the variation, over time, of the surface of the target object 70 and may control the output unit 10 or the moving unit 50 based on the collected information. The input unit 40 may determine whether the thickness of the target object 70 is uniform (e.g., substantially constant) or differs from one area to another area based on the detected surface information.

In response to the target object 70 having the same thickness in both the first area A1 and the second area A2, identical thickness information may be input. Accordingly, the target object 70 may be moved (S600), and the laser crystallization method returns to S100. More specifically, in response to the target object 70 having the same thickness in both the first area A1 and the second area A2, the second area A2 may be crystallized by applying the first laser light L1 to the second area A2, while maintaining the first energy E1. The surface information of the third area A3 may be collected with the use of the second laser light L2. The second area A2 to which the first laser light L1 is applied and the third area A3 to which the second laser light L2 is applied may be arranged at regular intervals.

The second area A2 and the third area A3 may have different thicknesses from each other. In response to the second area A2 and the third area A3 having different thicknesses from each other, the input unit 40 may detect the difference in thickness between the second area A2 and the third area A3, and may input the resulting surface information to the output unit 10 (S700).

The output unit 10 may calculate the surface variation of the target object 70 based on the information input thereto regarding the surface variation of the target object 70, and may provide the moving unit 50 with moving speed information and target location information indicating where the moving unit 50 is to be moved. Accordingly, the moving unit 50 may be moved to the second area A2 (S800).

The output unit 10 may emit second output laser light with the second energy E2 based on the surface variation of the target object 70 (S900). The laser crystallization system 1 may control the intensity of the first output laser light SL. The first energy E1 and the second energy E2 may be provided to different parts of the target object 70 having different thicknesses from each other.

According to the laser crystallization method of FIG. 6, because energy for collecting the surface information of the target object 70 and energy for crystallizing the target object 70 are both provided by a single source, the crystallization of the target object 70 may be facilitated, and productivity may be improved (e.g., increased). In addition, because the surface information of the target object 70 may be obtained by using split laser light, the degree of the crystallization of the target object 70 may be stably improved (e.g., increased) by controlling the energy for crystallizing the target object 70 in real time according to a variation in the thickness of the target object 70.

A method of fabricating a display device using the laser crystallization system 1, according to an exemplary embodiment, will hereinafter be described, taking an organic light-emitting display device as an example.

FIGS. 7 to 14 are cross-sectional views illustrating a method of fabricating a display device, according to an exemplary embodiment of the present invention.

Figure 7:
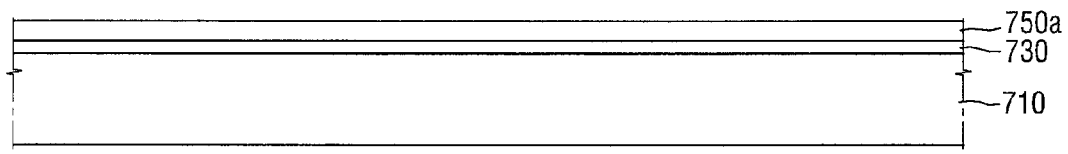
FIGS. 7 to 14 are cross-sectional views illustrating a method of fabricating a display device, according to an exemplary embodiment of the present invention.

Referring to FIG. 7, an amorphous silicon layer 750a is formed on an entire surface of an insulating substrate 710. The amorphous silicon layer 750a may be formed by a chemical vapor deposition (CVD) method using a $SiH_4$ gas as a source gas. A buffer layer 730 may be formed between the substrate 710 and the amorphous silicon layer 750a.

Figure 8:
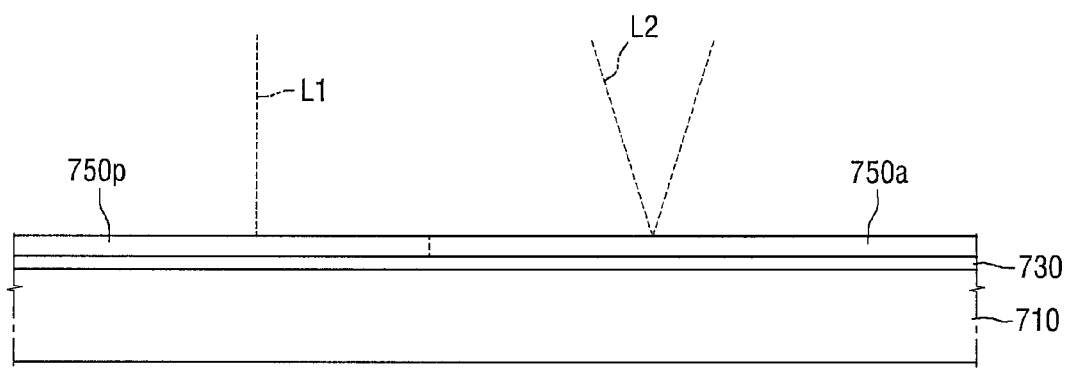

Referring to FIG. 8, a crystallized silicon layer 750P may be formed by crystallizing the amorphous silicon layer 750a. The crystallization of the amorphous silicon layer 750a may be performed by the laser crystallization method of FIG. 6.

Figure 9:
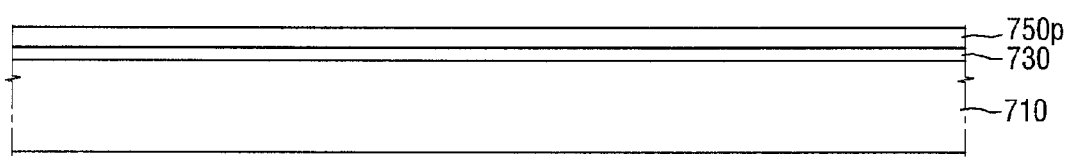

Referring to FIG. 9, the crystallized silicon layer 750P may be formed on the entire surface of the substrate 710 by uniformly (e.g., consistently) crystallizing the amorphous silicon layer 750a.

For convenience, in the description that follows, it is assumed that the substrate 710 is divided into three virtual regions, that is, a pixel region PXL where a pixel electrode 945 is formed, a transistor region TR where a thin-film transistor (TFT) is formed, and a capacitor region CAP where capacitor electrodes are formed.

Figure 10:
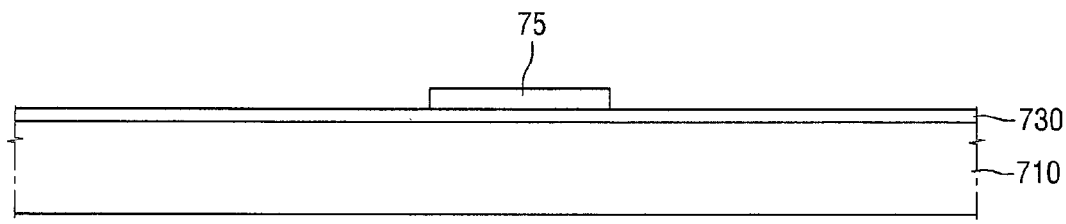

Referring to FIG. 10, a semiconductor layer 75 is formed in the transistor region TR by patterning the crystallized silicon layer 750P.

Figure 11:
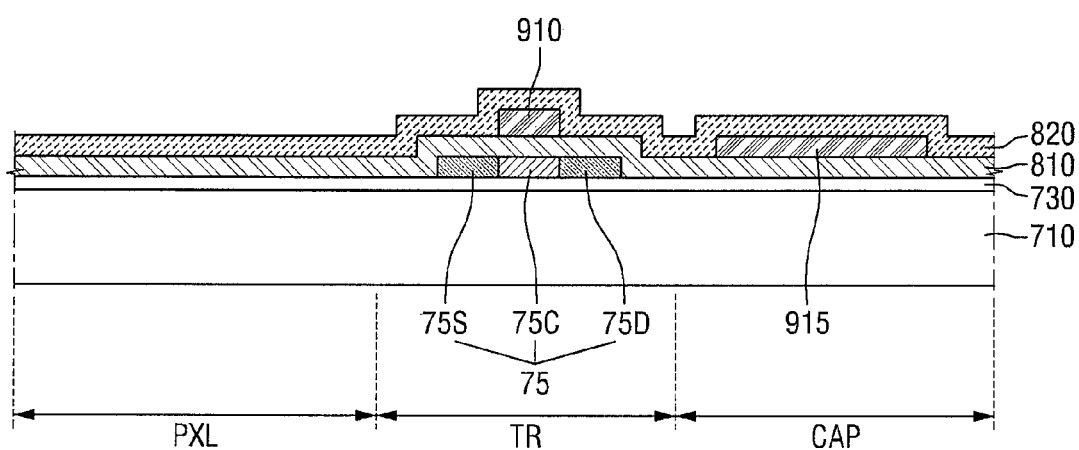

Referring to FIG. 11, a first insulating layer 810, which insulates the semiconductor layer 75, is formed on the entire surface of the substrate 710, and a gate electrode 910 is formed on the first insulating layer 810 to correspond to the semiconductor layer 75. The semiconductor layer 75 may be doped by using the gate electrode 910 as a mask. The doped semiconductor layer 75 may be divided into a source region 75S, a drain region 75D and an active region 75C. A second insulating layer 820, which insulates the gate electrode 910, is formed on the entire surface of the substrate 710.

During the formation of the gate electrode 910, a capacitor lower electrode 915 may be formed in the capacitor region CAP. The capacitor lower electrode 915 may be formed on the first insulating layer 810 in the capacitor region CAP.

Figure 12:
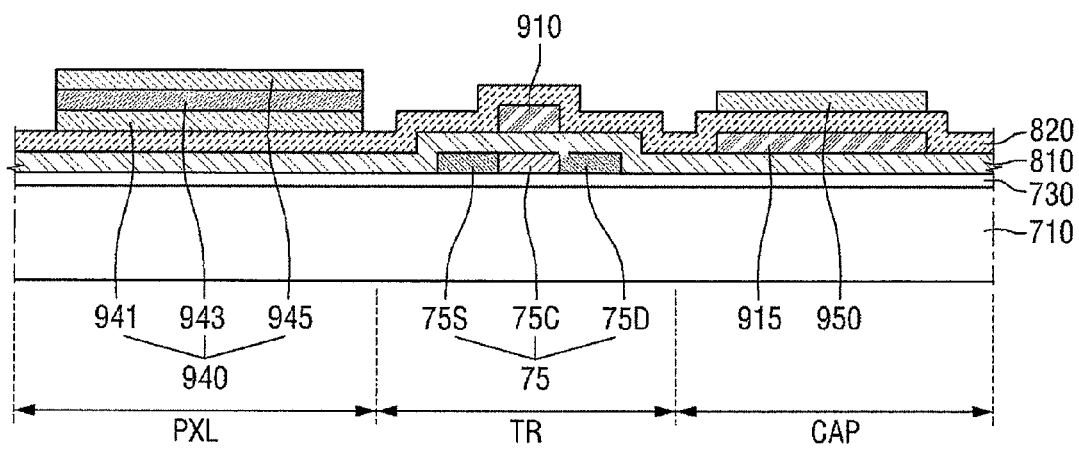

Referring to FIG. 12, an anode electrode 940 and a capacitor upper electrode 950 may be formed on the second insulating layer 820. The anode electrode 940 may be located in the pixel region PXL, and may include a lower electrode 941, a semi-transmissive layer 943 and the pixel electrode 945. The semi-transmissive layer 943 may be located between the lower electrode 941 and the pixel electrode 945. The semi-transmissive layer 943 may be formed of silver (Ag), and may improve (e.g., increase) the resonance efficiency of an organic light-emitting display device.

The lower electrode 941 may be formed of indium tin oxide (ITO), and may be located between the semi-transmissive layer 943 and the second insulating layer 820. The lower electrode 941 may be provided to improve (e.g., increase) the adhesiveness of silver (Ag) used in the semi-transmissive layer 943 with respect to an insulating material used in the second insulating layer 920.

Figure 14:
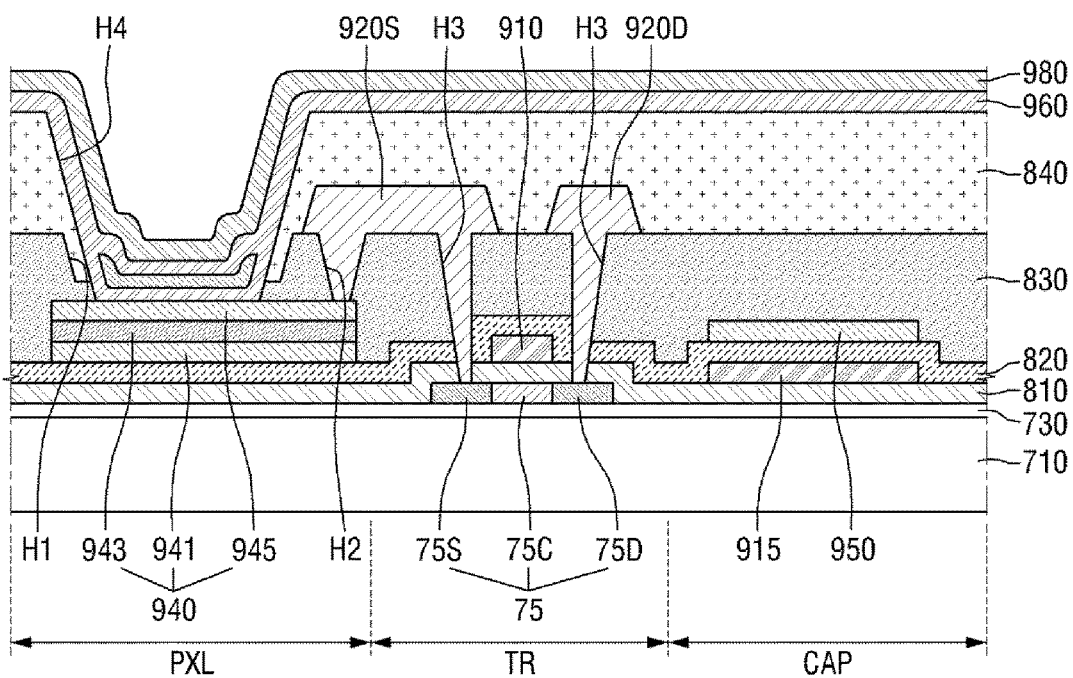

The pixel electrode 945 may contact an organic light-emitting layer 960 of FIG. 14 and may inject holes into the organic light-emitting layer 960.

The capacitor upper electrode 950 may be formed in the capacitor region CAP to overlap the capacitor lower electrode 915. The capacitor upper electrode 950 may be formed during the formation of the pixel electrode 945.

Figure 13:
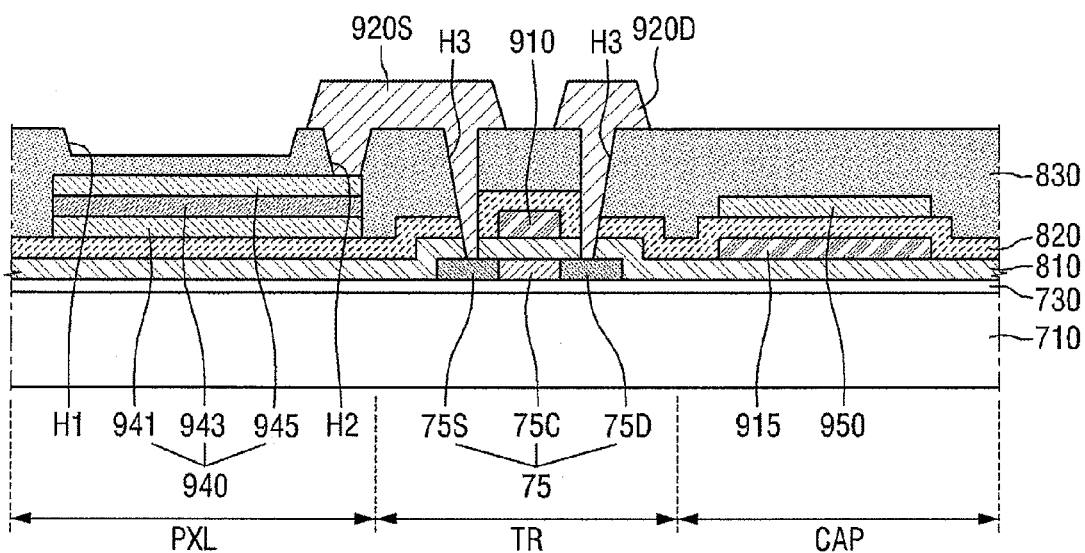

Referring to FIG. 13, a third insulating layer 830 is formed on the entire surface of the substrate 710 where the anode electrode 940 and the capacitor upper electrode 950 are formed. A first opening region H1 may be formed on the third insulating layer 830 in the pixel region PXL by using a halftone mask. A second opening region H2, which exposes part of the pixel electrode 945 therethrough, may also be formed in the pixel region PXL.

Third opening regions H3, which expose the source region 75S and the drain region 75D of the semiconductor layer 75, may be formed in the transistor region TR by etching the first insulating layer 810, the second insulating layer 820 and the third insulating layer 830. A source electrode 920S and a drain electrode 920D, which are connected to the source region 75S and the drain region 75D, respectively, that are exposed, may be formed by filling the third opening regions H3 with a metal.

The source electrode 920S may be connected to the source region 75S of the semiconductor layer 75 via one of the third opening regions H3, and may be connected to the pixel electrode 945 through the second opening region H2.

Referring to FIG. 14, a fourth insulating layer 840 is formed on the entire surface of the substrate 710 where the source electrode 920S and the drain electrode 920D are formed. A fourth opening region H4 may be formed by etching away part of the fourth insulating layer 840 that is formed in the first opening region H1.

Part of the pixel electrode 945 may be exposed through the fourth opening region H4. The organic light-emitting layer 960 may be formed on the exposed part of the pixel electrode 945 and the fourth insulating layer 840, and a cathode electrode 980 may be formed on the organic light-emitting layer 960, thereby forming an organic light-emitting display device 9.

Because a polycrystalline silicon layer that is uniformly crystallized by a laser crystallization system is used as the semiconductor layer 75, the uniformity of the resistance and the response speed (e.g., the substantial sameness of the resistance and speed) of TFTs may be improved (e.g., increased). Accordingly, the quality of the organic light-emitting display device 9 may be improved.

While the present invention has been particularly shown and described with reference to exemplary embodiments thereof, it will be understood by those of ordinary skill in the art that various suitable changes in design and detail may be made therein without departing from the spirit and scope of the present invention as defined by the following claims, and equivalents thereof. The exemplary embodiments should be considered in a descriptive sense only and not for purposes of limitation.

What is claimed is:

1. A laser crystallization system, comprising:
an output unit configured to generate output laser light;
an optical unit configured to split the output laser light into a first laser light and a second laser light, and to process the first laser light to have a crystallization energy density;
a moving unit configured to move a target object to be irradiated with the first laser light and the second laser light;
a detection unit configured to detect surface information of the target object utilizing the second laser light; and
an input unit configured to receive the detected surface information and to transmit a control signal to control at least one of the output unit and the moving unit, the control signal being based on the detected surface information,
wherein the laser crystallization system is configured to detect the surface information of the target object and to crystallize the target object utilizing only the output laser light.

2. The laser crystallization system of claim 1, wherein the optical unit comprises:
a spectral lens on an optical path of the output laser light and configured to split the output laser light into the first laser light and the second laser light;
a first reflective mirror on an optical path of the first laser light and configured to reflect the first laser light toward the target object;
a second reflective mirror on an optical path of the second laser light and configured to reflect the second laser light toward the target object; and
a density adjusting lens between the first reflective mirror and the spectral lens and configured to process the first laser light to have the crystallization energy density.

3. The laser crystallization system of claim 2, wherein the optical unit further comprises:
a projection lens between the target object and the first reflective mirror.

4. The laser crystallization system of claim 2, wherein the spectral lens comprises:
a first spectral lens configured to generate dispersed laser light with various directivities by dispersing the output laser light; and
a second spectral lens on an optical path of the dispersed laser light and configured to split the dispersed laser light into laser light with uniform directivities comprising the first laser light with a first directivity and the second laser light with a second directivity.

5. The laser crystallization system of claim 4, wherein the second spectral lens comprises:
a convex portion configured to generate the first laser light with the first directivity by splitting the dispersed laser light; and
a flat portion on one side of the convex portion and configured to generate the second laser light with the second directivity by splitting some of the dispersed laser light.

6. The laser crystallization system of claim 1, wherein the density adjusting lens comprises:
a first density adjusting lens configured to adjust the energy density of the first laser light;
a second density adjusting lens configured to make the energy density of the first laser light uniform; and
a third density adjusting lens configured to focus the processed first laser light.

7. The laser crystallization system of claim 6, wherein the optical unit comprises a second reflective mirror on an optical path of the second laser light and configured to reflect the second laser light toward the target object,
wherein the first density adjusting lens comprises:
a density adjusting portion on an optical path of the first laser light; and
wherein an extended portion extending from the density adjusting portion to an optical path of the second laser light and configured to change the optical path of the second laser light so as to direct the second laser light toward the second reflective mirror.

8. The laser crystallization system of claim 1, wherein the detection unit comprises a detector configured to detect a detection signal that is a reflection of the second laser light from the surface of the target object, and to detect the surface information of the target object, the surface information comprising thickness information and location information of the target object.

9. The laser crystallization system of claim 1, wherein the input unit comprises:
an indicator configured to display the detected surface information as collected information corresponding to a variation, over time, of the surface of the target object; and
a controller configured to control the output unit or the moving unit based on the collected information.

10. The laser crystallization system of claim 9, wherein the controller is further configured to adjust an intensity of the output laser light or a moving speed of the moving unit.

11. The laser crystallization system of claim 1, wherein an area of the target object to which the first laser is applied and an area of the target object to which the second laser light is applied are arranged at regular intervals.

12. The laser crystallization system of claim 1, wherein the moving unit comprises a stage configured to accommodate the target object, and a moving mechanism configured to move the stage.

13. The laser crystallization system of claim 1, wherein the moving unit is further configured to move in a direction from an area of the target object to which the first laser is applied to an area of the target object to which the second laser light is applied.

14. A laser crystallization method, the method comprising:
outputting first output laser light having a first energy;
splitting the laser light into a first laser light and a second laser light;
applying the first laser light and the second laser light to a target object;
crystallizing a first area of the target object utilizing the first laser light, and detecting surface information of a second area of the target object utilizing the second laser light;
determining the surface information of the second area; and
adjusting a crystallization energy for a thickness of the target object according to results of the determination.

15. The laser crystallization method of claim 14, wherein the adjusting of the crystallization energy comprises:
in response to the first area and the second area having a same thickness, moving the second area to a zone where the first laser light is applied; and crystallizing the second area utilizing the first laser light, and detecting surface information of a third area of the target object utilizing the second laser light.

16. The laser crystallization method of claim 14, wherein the adjusting of the crystallization energy comprises:
in response to the first area and the second area having different thicknesses, inputting surface information of the second area, moving the second area to a zone where the first laser light is applied, and outputting second output laser light with second energy, the second energy being different from the first energy; and
crystallizing the second area utilizing the first laser light and detecting surface information of a third area of the target object utilizing the second laser light.

* * * * *